United States Patent
Bianchini et al.

(10) Patent No.: US 10,994,467 B2
(45) Date of Patent: May 4, 2021

(54) METHOD FOR MANUFACTURING PACKAGING COMPRISING A CONTAINER PRINTED ON DIRECTLY AND TREATED BY PLASMA

(71) Applicant: SIDEL PARTICIPATIONS, Octeville-sur-Mer (FR)

(72) Inventors: Cedric Bianchini, Octeville-sur-Mer (FR); Guy Feuilloley, Octeville-sur-Mer (FR)

(*) Notice: Subject to any disclaimer, the term of this patent is extended or adjusted under 35 U.S.C. 154(b) by 488 days.

(21) Appl. No.: 15/556,142

(22) PCT Filed: Mar. 22, 2016

(86) PCT No.: PCT/FR2016/050623
§ 371 (c)(1),
(2) Date: Sep. 6, 2017

(87) PCT Pub. No.: WO2016/151231
PCT Pub. Date: Sep. 29, 2016

(65) Prior Publication Data
US 2018/0036935 A1     Feb. 8, 2018

(30) Foreign Application Priority Data
Mar. 25, 2015  (FR) ...................... 1552481

(51) Int. Cl.
| B29C 49/42 | (2006.01) |
| B29C 49/06 | (2006.01) |
| B29C 49/36 | (2006.01) |
| B29C 49/12 | (2006.01) |
| B29C 49/64 | (2006.01) |
| C23C 16/50 | (2006.01) |
| B29L 9/00  | (2006.01) |

(Continued)

(52) U.S. Cl.
CPC .......... *B29C 49/4273* (2013.01); *B29C 49/06* (2013.01); *B29C 49/12* (2013.01); *B29C 49/36* (2013.01); *B29C 49/6409* (2013.01); *C23C 16/50* (2013.01); *B29C 49/10* (2013.01); *B29C 59/142* (2013.01); *B29C 2049/027* (2013.01); *B29C 2795/007* (2013.01); *B29K 2049/00* (2013.01); *B29K 2067/003* (2013.01); *B29K 2995/0067* (2013.01); *B29K 2995/0069* (2013.01); *B29L 2009/005* (2013.01); *B29L 2031/7158* (2013.01); *H05H 2001/4622* (2013.01)

(58) Field of Classification Search
CPC ................................. B29C 49/4273
See application file for complete search history.

(56) References Cited

U.S. PATENT DOCUMENTS

2010/0206232 A1* 8/2010 Duclos ..................... B05D 1/62
                                                            118/723 R

FOREIGN PATENT DOCUMENTS

WO    WO 2001/62613    *   8/2001

* cited by examiner

*Primary Examiner* — Larry W Thrower

(57) ABSTRACT

Disclosed is a method for manufacturing packaging including a container. The method includes: an operation of forming the container via blow molding or stretch blow molding from a plastics preform, an operation of treating an inner surface of the container, during which a thin barrier layer is formed on the inner surface via plasma-enhanced chemical vapor deposition; an operation of printing on an outer surface of the container, during which ink is deposited on the outer surface to form a decorative and/or informative inscription thereon.

15 Claims, 4 Drawing Sheets

(51) Int. Cl.
*B29L 31/00* (2006.01)
*B29K 67/00* (2006.01)
*B29C 49/02* (2006.01)
*B29C 59/14* (2006.01)
*H05H 1/46* (2006.01)
*B29C 49/10* (2006.01)

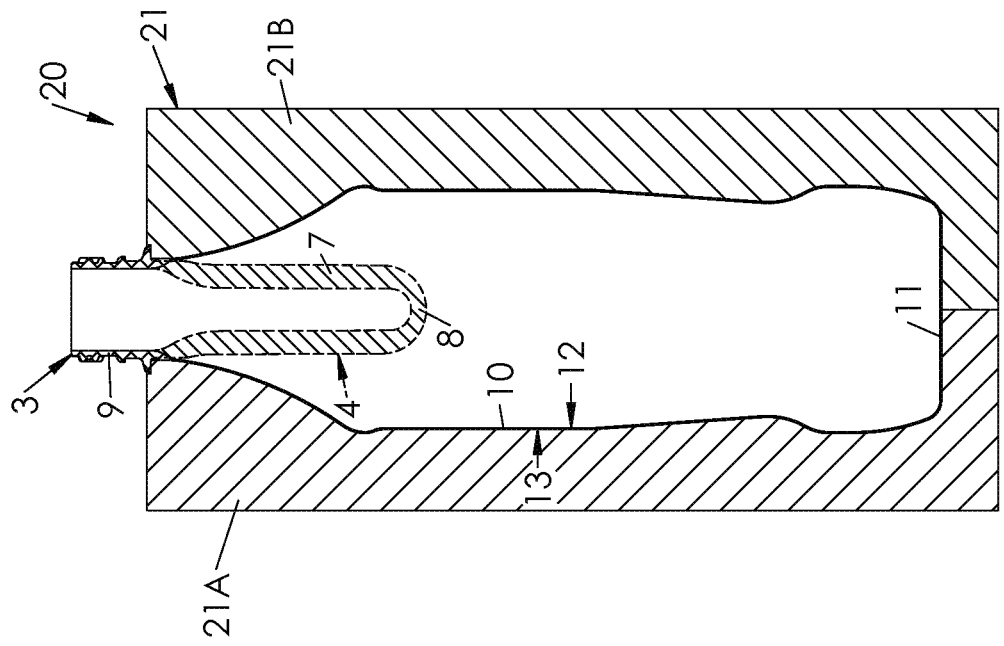
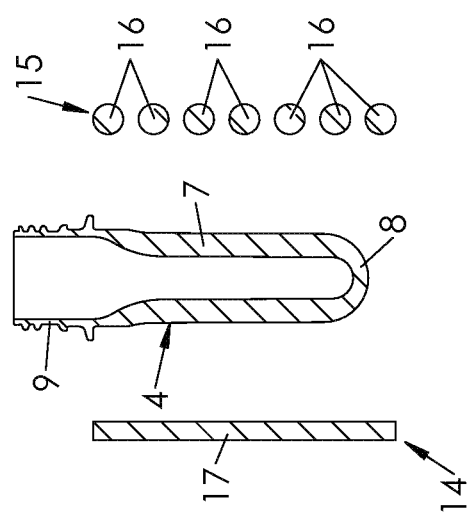

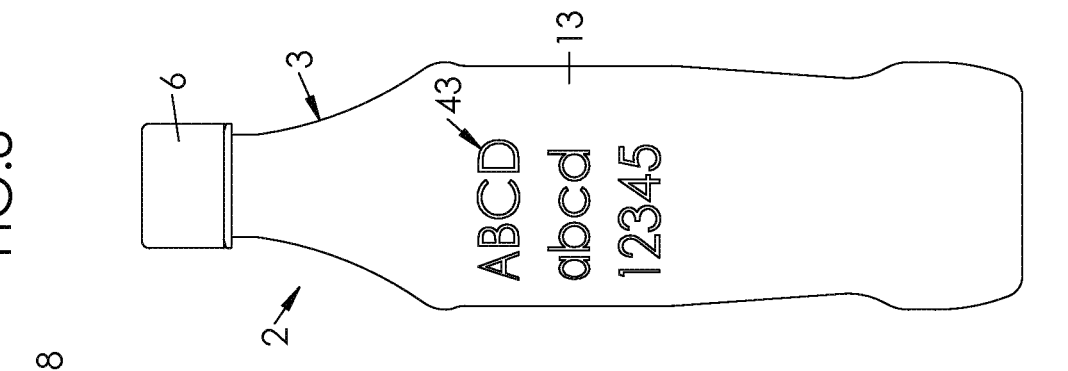
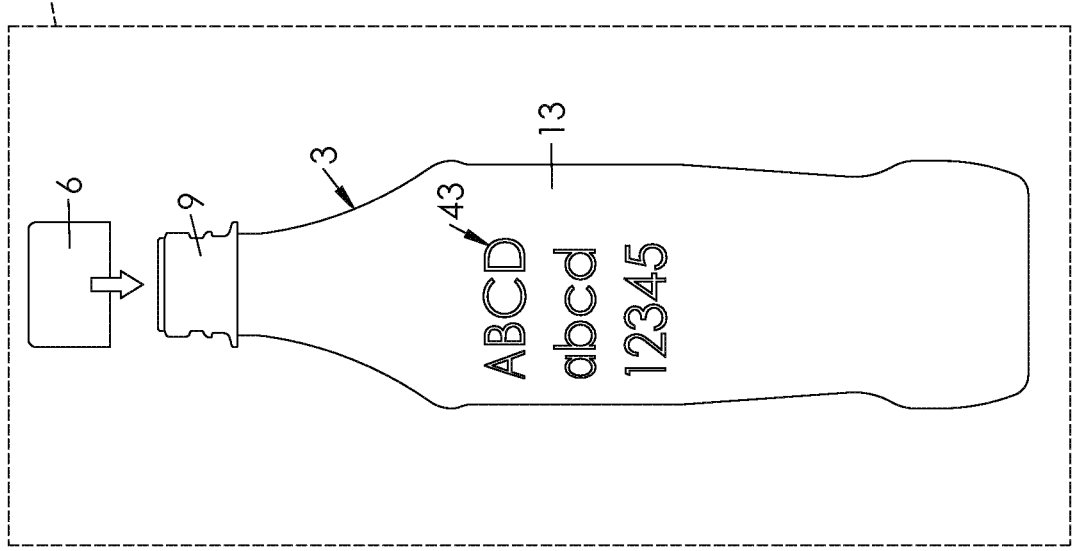
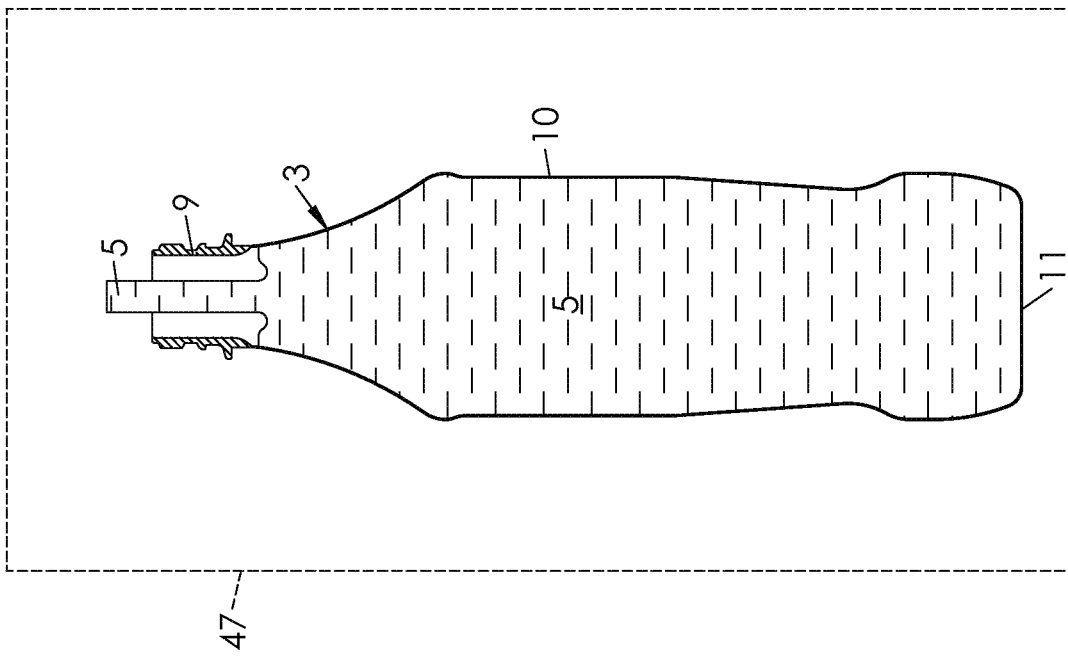

METHOD FOR MANUFACTURING PACKAGING COMPRISING A CONTAINER PRINTED ON DIRECTLY AND TREATED BY PLASMA

The invention relates to the manufacturing of packaging comprising a container to which is connected a decorative and/or informative inscription.

In the food industry, the inscription is conventionally printed on a label that is itself glued to an outer surface of the container by means of a machine called a labeling machine, cf., for example, the European patent application EP 2 828 170 (Sidel).

In the cosmetics industry, it is common that the inscription be directly printed on the outer surface of the container. It is true that the plastic cosmetics containers, which generally have a smooth outer surface, lend themselves rather well to such printing. In contrast, numerous plastic containers dedicated to the food industry lend themselves rather poorly thereto because they are in general provided with ribbed outer surfaces that are intended to improve their mechanical strength to compensate for their small mass, dictated by very tight selling prices.

The U.S. patent application US 2013/0269551 (Till GmbH) proposes a machine for direct printing and polychromy of containers such as bottles or cans.

Direct printing of decorative inscriptions on the outer surface of a container ensures several advantages. First of all, from an economical standpoint, direct printing makes it possible to dispense with a label. Next, from an esthetic standpoint, direct printing leaves exposed the outer surface of the container, ordinarily covered by a label. Finally, from a practical standpoint, direct printing makes it possible to carry out progressive, even personalizable, inscriptions, while the labels are generally pre-printed and stored in bulk, which does not leave any room for personalization (or targeted marketing).

However, one problem that is posed by the direct printing of the plastic containers in the food industry is the migration of certain components of the inks through the wall of the containers, which can in some cases turn out to be porous. This is thus true in particular of PET (polyethylene terephthalate), used in bulk for the manufacturing of bottles designed for beverages. However, most of the inks and their adjuvants include complex chemical compounds (in particular aromatic molecules) that should not be ingested.

One approach is to print the outer surfaces of the containers using food inks, but these inks are generally water-soluble and run the risk of being worn off or smudged by the user's hand gripping the container. Another approach consists in using polymer inks that, after having been applied in fluid form, undergo a forced drying by means of ultraviolet radiation, which brings about a cross-linking of the polymer and its rapid hardening. However, it may be that the ultraviolet exposure is not total. A portion of the ink that has not undergone cross-linking then remains fluid and can migrate toward the interior of the container through the wall.

One objective is consequently to propose a packaging that includes a container on the outer surface of which an inscription can be printed directly without running the risk of contaminating the contents.

For this purpose, in the first place, a method for manufacturing a packaging comprising a container is proposed, with this method comprising:

An operation for forming a container by blow molding or stretch blow molding from a preform made of plastic;

An operation for treating an inner surface of the container, during which a thin barrier layer is formed on the inner surface by plasma-assisted chemical vapor deposition;

An operation for printing an outer surface of the container, during which an ink is deposited on the outer surface to form there a decorative and/or informative inscription.

The barrier layer forms an obstacle to the migration of possibly toxic chemical compounds in the ink toward the interior of the container, thus protecting its contents from any contamination.

Various additional characteristics can be provided in this method, by themselves or in combination:

The barrier layer comprises amorphous hydrogenated carbon;
The printing is carried out by spraying;
The printing is carried out by ink jet;
During the printing operation, the container is driven in rotation;
Prior to the operation for forming the container, an operation for thermal conditioning of the preform is provided.

In the second place, an installation for the manufacturing of packaging, each comprising a container, is proposed, with this installation comprising:

A unit for forming containers from preforms made of plastic;
A unit for printing an outer surface of the containers;
A unit for treating an inner surface of the containers, where said unit is able to form a thin barrier layer there by plasma-assisted chemical vapor deposition, with this treatment unit being interposed between the forming unit and the printing unit.

Various additional characteristics can be provided in this installation, by themselves or in combination:

The treatment unit is adjacent to the forming unit;
The treatment unit is adjacent to the printing unit;
The installation also comprises a unit for thermal conditioning of preforms.

Other objects and advantages of the invention will become evident from the description of an embodiment, given below with reference to the accompanying drawings in which:

FIG. 2 is a diagrammatic cutaway view of the thermal treatment unit;

FIG. 3 is a diagrammatic cutaway view of a mold of the forming unit;

FIG. 6 is a diagrammatic view that illustrates the filling of the container within a filling unit;

FIG. 7 is a diagrammatic view that illustrates the stoppering of the filled container, within a stoppering unit;

FIG. 8 is a view of the packaging including the container that is provided with its barrier layer that is printed, filled, and stoppered.

Figure 1:
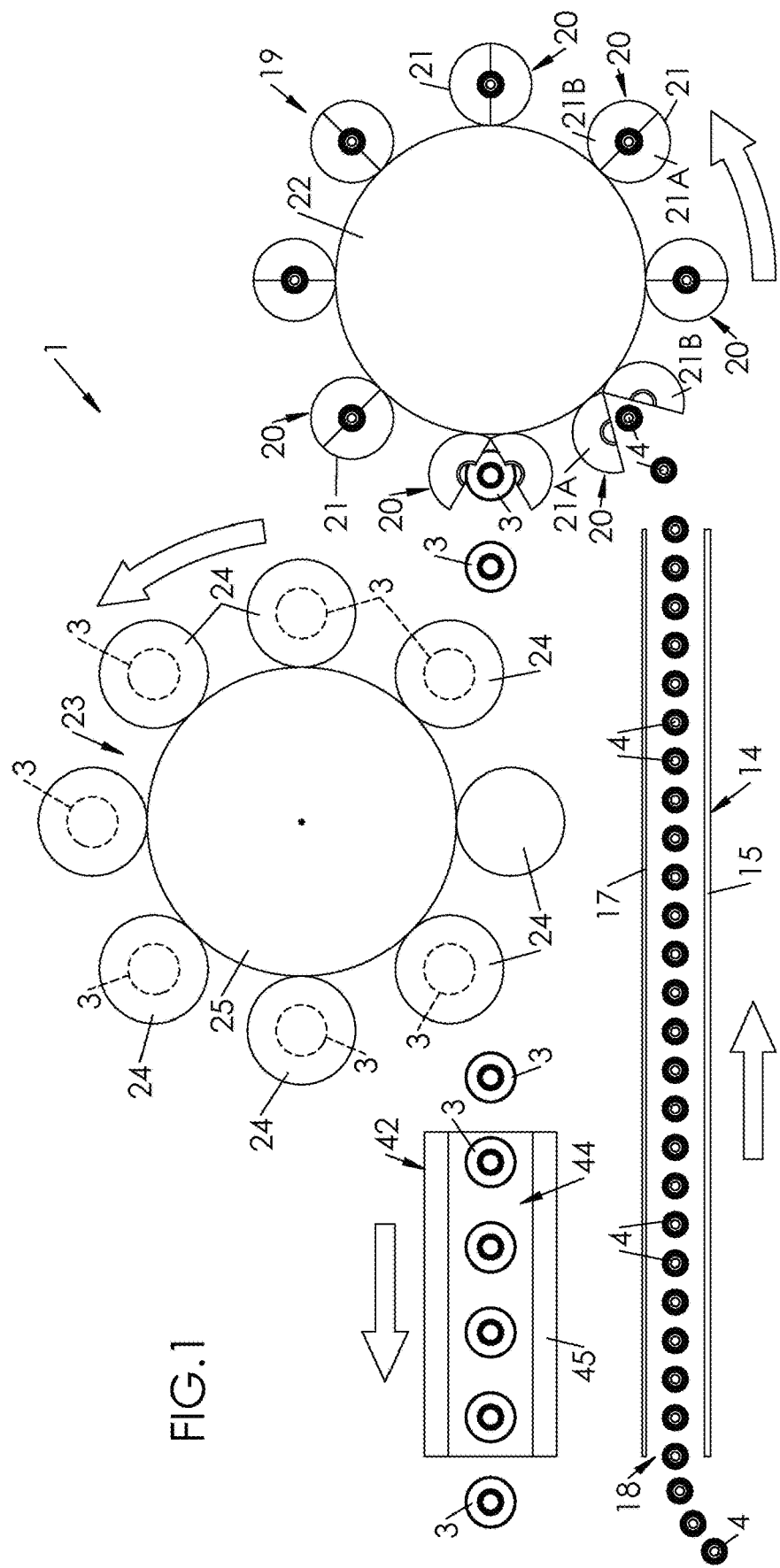
FIG. 1 is a diagrammatic view of an installation for the manufacturing of packagings from preforms, which comprises a thermal treatment unit, a forming unit, a plasma treatment unit, and a printing unit.

FIG. 1 shows an installation 1 for the manufacturing of packagings 2, with each packaging 2 (readily visible in FIG. 8) comprising a container 3 that is formed from a preform 4 made of plastic, a product 5 (in particular liquid, paste or powder) contained in the container 3, and a stopper 6 closing the container 3.

The plastic in which each preform 4 is made can be a polyester, in particular PET (polyethylene terephthalate), which offers good mechanical rigidity while having good transparency qualities.

A preform 4 is diagrammatically illustrated in FIG. 2. It comprises an overall cylindrical body 7, a hemispherical bottom 8 that closes the body 7 at a lower end, and an open neck 9 that extends the body 7 at an upper end. The neck 9 has its final shape and remains unchanged during the forming of the container 3.

The container 3 that is formed from the preform 4 is illustrated in a cutaway in FIG. 3. It comprises a side wall 10 that comes from the body 7 of the preform, a bottom 11 that comes from the bottom 8 of the preform 4 and that extends from a lower end of the side wall 10, and the neck 9 that extends from an upper end of the side wall 10. The container 3 has an inner surface 12 that delimits the inside volume of the container 3, intended to accommodate the product 5, and an opposite outer surface 13, by which the container 3 is intended to be manipulated by a user.

In the first place, the installation 1 comprises a unit 14 for thermal conditioning of the preforms 4. The thermal conditioning unit 14 comprises at least one radiating wall 15 that is equipped with radiation sources 16, and, if necessary, at least one reflecting wall 17 placed opposite the radiating wall 15. The sources 16 emit in a range of the electromagnetic spectrum that can bring about the heating of the preforms 4. It can be a matter in particular of the microwave range or else the infrared range. The sources 16 can be halogen lamps that emit in the infrared or else lasers (for example diodes, typically VCSEL diodes).

In normal operation (i.e., in serial production), the preforms 4 are introduced at ambient temperature into the thermal conditioning unit 14 through an input 18 of the former, for example by means of a wheel or a feed conveyor. Then, the preforms 4 are heated in a stream in the thermal conditioning unit 14 at a temperature that is higher than the glass transition temperature of the material (the final temperature of the preforms 4 at the output of the thermal conditioning unit 14 is, for example, on the order of 120° C. for PET, whose glass transition temperature is approximately 80° C.).

In the thermal conditioning unit 14, each preform 4 is advantageously mounted on a pivoting support called a spinner, so as to expose the entire body 7 and the bottom 8 to the radiation of the sources 16. In the example that is illustrated in FIG. 2, the preforms 4 are conveyed neck up in the thermal conditioning unit 14, but they could be conveyed neck down. To evacuate at least a portion of the excess heat produced by the wall 15 that is radiating or radiated by the preforms 4 themselves, the thermal conditioning unit 14 can be equipped with a ventilation system that is positioned at right angles to the neck 9, which is to remain at a temperature that is close to the ambient temperature.

In the second place, the installation 1 comprises a unit 19 for forming containers 3 by blow molding or stretch blow molding from preforms 4 that are obtained from the thermal conditioning unit 14. As is seen in FIG. 1, the forming unit 19 is located downstream from the thermal conditioning unit 14 (the arrows illustrate the direction of movement of the preforms 4, and then of the containers 3 within the installation 1). More specifically, in the example illustrated, the forming unit 19 is adjacent to the thermal conditioning unit 14. Taking into account the speed of advance of the preforms 4 (for a production of several tens of thousands of containers 3 per hour), the preforms 4 do not have time to cool between the output of the thermal conditioning unit 14 and the input of the forming unit 19.

In other words, the thermal profile of the preforms 4 at the input of the forming unit 19 is essentially identical to the one that they present at the output of the thermal conditioning unit 14.

The forming unit 19 is equipped with at least one forming station 20 (and in this case a series of forming stations 20), each equipped with a mold 21 bearing the impression of the model of the container that is to be formed.

According to an embodiment that is illustrated in FIG. 1, the forming unit 19 comprises a turning carousel 22 on which the forming stations 20 are mounted.

Each forming station 20 is equipped with a device for injecting, into the preform 4, a gas (in particular air) under pressure (between approximately 5 bar and 30 bar). According to an embodiment corresponding to a method for forming by stretch blow molding, each forming station 20 is also equipped with a stretching rod that can move in translation in relation to the mold 21.

In the example that is illustrated, the mold 21 is of the portfolio type and comprises two half-molds 21A, 21B that are mounted articulated in relation to one another between an open position (visible in FIG. 1) in which the half-molds 21A, 21B are separated from one another in an angular manner to make it possible to insert a preform 4 that is obtained from the thermal conditioning unit 14, and a closed position (also visible in FIG. 1 as well as in FIG. 3) in which the half-molds 21A, 21B are applied against one another to form together the impression of the container 3 that is to be formed.

In the third place, the installation 1 comprises a unit 23 for treating containers 3 with plasma, which is advantageously adjacent to the forming unit 19. More specifically, the treatment unit 23 is arranged to carry out the plasma-assisted chemical vapor deposition of a thin barrier layer on the inner surface 12 of each container 3 that is obtained from the forming unit 19.

This layer can be composed of amorphous hydrogenated carbon (a-C:H), which offers the advantage of forming a barrier with numerous molecules with which the outer surface 13 of the container 3 is in contact, and with which the material (for example, PET) can prove permeable. Other types of thin layers than those based on carbon may be suitable, in particular based on silicon oxide or aluminum oxide.

The unit 23 for treatment with plasma comprises one (or, as in the example illustrated, several) plasma treatment station(s) 24, configured for accommodating and treating a container 3 at the same time. In the example illustrated, the treatment unit 23 comprises a series of treatment stations 24 that are all identical, and a turning structure 25 (such as a carousel) on which are mounted the treatment stations 24, which are, for example, 24, or else 48, in number, in such a way as to make possible a plasma treatment of the containers 3 at an industrial pace (several tens of thousands per hour).

Figure 4:
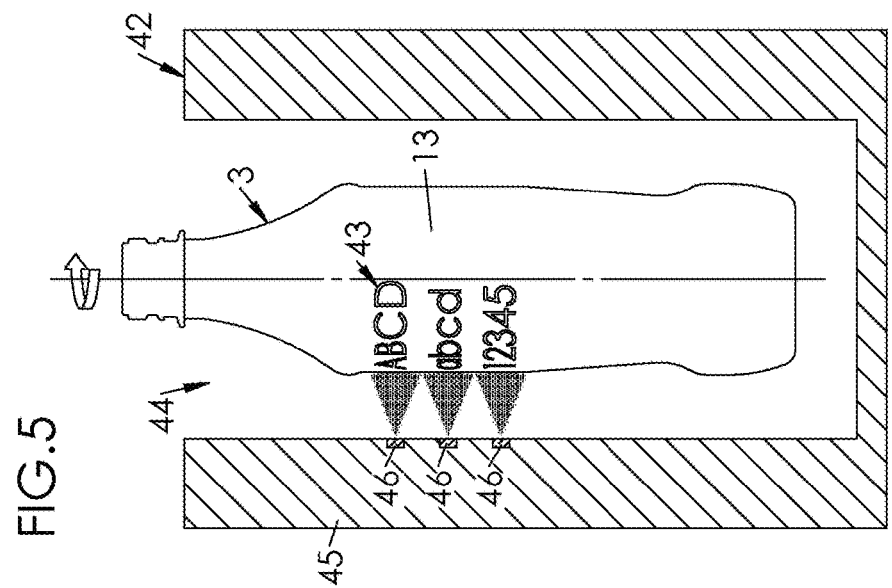
FIG. 4 is a cutaway view of a station of the plasma treatment unit.

As illustrated in FIG. 4, each treatment station 24 comprises an outer cavity 26 with an advantageously cylindrical shape, made in a conductive material, for example metal (typically steel or, preferably, aluminum or in an aluminum alloy) and sized to make it possible to set up within it an electromagnetic wave that is stationary at a predetermined resonance frequency in the microwave range, and more specifically close to 2,450 MHz (or 2.45 GHz).

Each treatment station 24 also comprises a tubular chamber 27, mounted in a coaxial and airtight manner in the cavity 26 and made of a material (for example quartz) that is transparent at least to microwaves.

According to a particular embodiment, illustrated in FIG. 4, the chamber 27 is, at a lower end, fitted into an additional zone formed in a lower wall of the cavity 26 in an airtight manner.

At an upper end, the chamber 27 is closed in an airtight manner by a detachable cover 28 that makes it possible to insert a container 3 into the chamber 27 to make possible its plasma treatment and to remove it at the end of the plasma treatment.

As FIG. 4 clearly shows, each treatment station 24 is equipped with a support 29 (in particular in the form of a fork) that works with the neck 9 of the container 3 to ensure the suspension of the former in the chamber 27, and various joints that ensure the sealing of the inner volume of the container 3 relative to the chamber 27.

The following are thus separated in an airtight manner:
The interior of the container 3,
The interior of the chamber 27 with respect to the exterior of the container 3,
The interior of the cavity 26 with respect to the exterior of the chamber 27.

Each treatment station 24 also comprises:
A primary vacuum circuit comprising a primary vacuum pump 30 making it possible to produce a forced vacuum (on the order of several microbar—1 microbar=$10^{-6}$ bar) in the container 3, via a nozzle 31 that is formed in the cover 28 and that empties into the container 3 (when the former is present), and
A secondary vacuum circuit comprises a secondary vacuum pump 32 that makes it possible to make a mean vacuum (on the order of several millibar) in the chamber 27 outside of the container 3 to prevent the former from contracting under the action of the pressure difference on both sides of its side wall 10.

Each plasma treatment station 24 also comprises an injection device 33, in the container 3, of a precursor gas such as acetylene (of formula $C_2H_2$). As FIG. 4 shows, this device 33 comprises an injector 34 that is connected, via a hose 35, to a source (not shown) of precursor gas, and an injection tube 36 that is connected to the injector 34 to direct the precursor gas into the container 3.

For more detail relative to the structure of the treatment station 24, one skilled in the art can refer to the description of the patent application US 2010/0206232.

Each plasma treatment station 24 also comprises a generator 37 of electromagnetic waves in the microwave range, and more specifically, here, in the vicinity of 2,450 MHz (or 2.45 GHz). According to an embodiment that is illustrated in FIG. 4, the generator 37 is a magnetron, and it is coupled to the cavity 26 by means of a waveguide 38 that empties laterally into the cavity 26.

As FIG. 4 further shows, the treatment station 24 also comprises a pair of superposed annular plates, namely an upper plate 39 and a lower plate 40 that are placed in the cavity 26 around the chamber 27 by being offset vertically in such a way as to be located on both sides of the waveguide 38. The plates 39, 40 are made of an electrically conductive material (for example, made of steel or aluminum), and have the function of confining the electromagnetic field in the zone where the container 3 is found. The plates 39, 40 are attached to rods 41 that extend vertically through the cavity 26 and make it possible to adjust the position of the plates 39, 40 in such a way as to make possible the treatment of containers 3 of varied sizes. For this purpose, at least one of the rods 40 can be threaded by being helically meshed with a tapping made in at least one of the plates 39, 40. The rotation of the threaded rod thus makes it possible to adjust the vertical position of the plate(s) 39, 40.

In the fourth place, the installation 1 comprises a printing unit 42 placed downstream from (and, for example, in a manner adjacent to) the plasma treatment unit 23.

Figure 5:
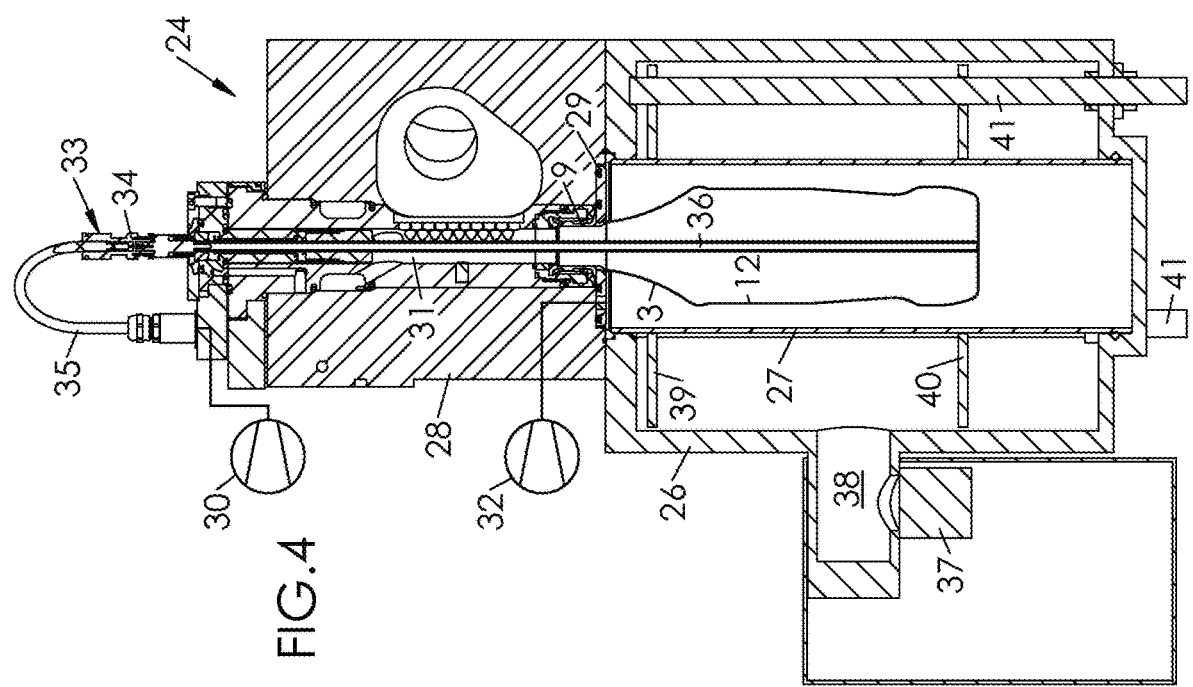
FIG. 5 is a diagrammatic cutaway view of the printing unit.

This printing unit 42 is arranged to print an inscription 43 (informative and/or decorative) directly on the outer surface 13 of the containers 3. According to an embodiment that is illustrated in FIGS. 1 and 5, the printing unit 42 comprises a tunnel 44 within which the containers 3 travel. On at least one side of the tunnel 44, the printing unit 42 comprises a wall 45 that is equipped with one (or more, as in the example that is illustrated in FIG. 3) printing head(s) 46 arranged to apply one (or more) ink(s) on the outer surface 13 of the containers 3.

The ink (the inks) can be in the liquid state or in the solid state. It (they) is (are) stored in, for example, a reservoir or a toner that is connected to the printing head(s) 46 in a conventional way by a feed system. If the inscription 43 is to be produced by polychromy, it is advantageous to provide several inks of different colors (typically black, cyan, yellow, magenta) whose mixture (or superposition) makes it possible to produce the majority of shades and contrasts. The printing unit 42 can use the ink jet technology (in particular by a piezo-electric method or by a thermal method), with the (or each) printing head 46 being arranged to spray the ink in the form of fine droplets that are deposited on the outer surface of the container to form the inscription 43 there, as shown in a diagram in FIG. 5. As a variant, the printing unit can use the laser technique.

To make possible an extension of the inscription 43 over a significant portion of the (and, for example, over the entire) circumference of the container 3, it is preferable to drive the former in rotation with regard to the printing head(s) 46, as illustrated by the arrow in FIG. 5. This rotation can be ensured by a spinner, in a manner that is similar to that of the preforms 4 in the thermal conditioning unit 14.

As a variant, if only a portion (for example, a flat facet) of the container 3 is to be printed, it is not necessary to drive the container 3 in rotation; it can, however, be driven in translation to travel in front of the printing head(s).

The manufacturing of a packaging 2 from a preform 4 is carried out as follows.

The preform 4, stored in advance in a hopper or obtained directly from its manufacturing by plastic injection, is inserted into the thermal conditioning unit 14 where it undergoes heating that brings it to a temperature that is higher than the glass transition temperature of its material.

At the output of the thermal conditioning unit 14, the hot preform 4 is transferred to the forming unit 19 where an operation for forming the container 3 by blow molding or stretch blow molding from the preform 4 is carried out in the mold 21. More specifically, the preform 4 is placed in a mold 21 that is initially in the open position, by means of a gripping clamp. As the rotation of the forming unit 19 proceeds, the mold 21 is closed again, and a fluid (typically air) under pressure is injected into the preform 4, which brings about its swelling until the wall of the mold 21 is reached, thus imparting to the preform 4 the impression of the container 3. Then, the mold 21 opens again, and the container 3 that is formed is ejected from the mold 21 by being picked up by a transfer device (such as a wheel that is equipped with gripping clamps).

At the exit from the forming unit 19, the formed container 3 that is ejected from its mold 21 is transferred to the plasma treatment unit 23 where an operation for treating the inner surface 12 of the container 3 is carried out, in a plasma treatment station 24, during which treatment operation a thin barrier layer is formed on the inner surface 12 by plasma-assisted chemical vapor deposition.

More specifically, the container 3 that is obtained from the forming unit 19 is, by means of the support 29, suspended in the chamber 27. The sealing is carried out, on the one hand, in the area of the neck 9 of the container 3 between the interior and the exterior of the former (i.e., in the chamber), and, on the other hand, between the chamber 27 and the cavity 26.

An inner partial vacuum is produced in the container 3 by means of the primary vacuum pump 30 via the nozzle 31, with the residual pressure in the container 3 being several microbar.

A partial vacuum is also produced in the chamber 27 outside of the container 3 by means of the secondary vacuum pump 32 so as to prevent a crushing of the former under the pressure difference on both sides of its side wall 10.

The precursor gas is then injected into the container 3 by means of the injector 34. The primary vacuum pump 30 is kept open to make possible the renewal of the precursor gas in the container 3 during treatment.

The generator 37 is activated. The propagation of the microwaves in the cavity 26 produces a superposition of incident and reflected waves and the setting-up in the cavity 26, for certain frequencies, of a stationary microwave electrical field, whose spatial distribution has, in the zone of the container 3, a local concentration of energy that makes it possible to trigger a plasma in the precursor gas.

The plasma results from the molecular breakdown of the precursor gas by the microwave energy that is concentrated in the core of the container 3. This molecular breakdown of the precursor gas (in this case, acetylene) produces a soup of varied volatile radicals such as $C_xH_y$, where x and y are real numbers with $x \geq 0$ and $y \geq 0$, at least one part of which is ionic.

At least a portion of these $C_xH_y$ radicals is deposited on the inner surface 12 of the container 3, thus contributing to the generation of a thin layer of amorphous hydrogenated carbon a-C:H. This type of material appears in the center of the ternary diagram of carbon-hydrogen equilibrium, as illustrated in particular in the Encyclopédie Ullmann de l'industrie chimique [Ullmann's Encyclopedia of Industrial Chemistry], $5^{th}$ Edition, Volume A26, p. 720.

The inner partial vacuum, the outer partial vacuum, the injection of precursor gas, and the electromagnetic wave are maintained, to support the plasma, for a predetermined treatment period of between 1 s and 5 s, with the layer ultimately having a thickness of between 0.050 μm and 0.200 μm.

With the treatment finished, the plasma is extinguished (by cutting off the generator 37 and/or by cutting off the injection of the precursor gas), and the treated container 3 (i.e., provided with its barrier layer) is evacuated from the plasma treatment unit 23 and transferred to the printing unit 42, by means of a transfer device such as a wheel that is provided with gripping clamps.

A printing operation of the outer surface 13 of the container 3 is carried out in the printing unit 42, during which operation the ink is deposited on the outer surface 13 to form the inscription 43 there.

The thin layer that is formed in the plasma treatment unit 23 on the inner surface 12 of the container 3 forms an obstacle to the migration of compounds of the ink (or inks) toward the interior of the container 3, which makes it possible to preserve its contents (i.e., the product 5) from any chemical contamination, and therefore to preserve the organoleptic properties of the former as well as the health of the consumer.

With this barrier thus erected, it is possible to use inks and solvents that, although not food, still have good physico-chemical properties (in particular good adhesion to the outer surface of the container, good boldness of color, and good contrast, enhancing the readability of the inscription 43).

Each printed container 3 is, at the output of the printing unit 42, transferred to a filling unit 47 within which a product 5 (powder, liquid or paste) is poured into the container 3 (FIG. 6).

The filled container 3 is then transferred to a stoppering unit 48 (cf. FIG. 7—the filling unit 47 and the stoppering unit 48 can form one and the same machine provided with a single carousel, as is common) within which a stopper 6 is connected and screwed onto the neck 9 to carry out the airtight closing of the container 3, which completes the production of the packaging 2 (FIG. 8). The former can then undergo an additional conditioning step, with several packagings being, for example, grouped to form a pack, which can be packaged in cardboard and/or covered in film, and then, if necessary, put onto pallets to facilitate handling and transport to distribution zones.

In an alternative manner, it is possible to initiate the printing of the container 3 after its filling (and its stoppering). However, with the product being able to contaminate the outer surface 13 of the container 3 and therefore to alter the application of the ink (or inks), it is preferable to initiate the printing before initiating the filling.

The invention claimed is:

1. Method for manufacturing a packaging (2) comprising a container (3), with the method comprising:
    forming the container (3) by blow molding or stretch blow molding from a preform (4) made of plastic;
    printing an outer surface (13) of the container (3), during which an ink is deposited directly onto the outer surface (13) to form thereon a decorative and/or informative inscription (43), wherein the printing is carried out by ink jet or laser; and
    treating, between the forming and printing, an inner surface (12) of the container (3) with a layer of plasma-assisted chemical vapor deposition, the layer having sufficient thickness to form a barrier between the inner surface (12) and contents of the container (3).

2. Manufacturing method according to claim 1, wherein the barrier layer comprises amorphous hydrogenated carbon.

3. Manufacturing method according to claim 1, wherein the printing is carried out by spraying.

4. Manufacturing method according to claim 1, wherein during the printing operation, the container (3) is driven in rotation.

5. Manufacturing method according to claim 1, further comprising, prior to the operation for forming the container (3), an operation for thermal conditioning of the preform (4).

6. Manufacturing method according to claim 2, wherein the printing is carried out by spraying.

7. Manufacturing method according to claim 2, wherein during the printing operation, the container (3) is driven in rotation.

8. Manufacturing method according to claim 3, wherein during the printing operation, the container (3) is driven in rotation.

9. Manufacturing method according to claim 1, wherein during the printing operation, the container (3) is driven in rotation.

10. Manufacturing method according to claim 6, wherein during the printing operation, the container (3) is driven in rotation.

11. Manufacturing method according to claim 2, further comprising, prior to the operation for forming the container (3), an operation for thermal conditioning of the preform (4).

12. Manufacturing method according to claim 3, further comprising, prior to the operation for forming the container (3), an operation for thermal conditioning of the preform (4).

13. Manufacturing method according to claim 1, further comprising, prior to the operation for forming the container (3), an operation for thermal conditioning of the preform (4).

14. Manufacturing method according to claim 4, further comprising, prior to the operation for forming the container (3), an operation for thermal conditioning of the preform (4).

15. Manufacturing method according to claim 6, further comprising, prior to the operation for forming the container (3), an operation for thermal conditioning of the preform (4).

* * * * *